(12) United States Patent
Van den Dungen et al.

(10) Patent No.: US 9,036,127 B2
(45) Date of Patent: May 19, 2015

(54) LITHOGRAPHIC APPARATUS

(75) Inventors: Clemens Johannes Gerardus Van den Dungen, Eindhoven (NL); Nicolaas Franciscus Koppelaars, Oisterwijk (NL); Martinus Hendrikus Antonius Leenders, Rhoon (NL); Paulus Martinus Maria Liebregts, Veldhoven (NL); Johannes Catharinus Hubertus Mulkens, Waalre (NL); Erik Henricus Egidius Catharina Eummelen, Eindhoven (NL); Marcel Beckers, Eindhoven (NL); Richard Moerman, Son (NL); Cédric Désiré Grouwstra, Eindhoven (NL); Danny Maria Hubertus Philips, Son en Breugel (NL); Remko Jan Peter Verhees, Asten (NL); Pieter Mulder, Duizel (NL); Evert Van Vliet, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1170 days.

(21) Appl. No.: 12/423,528

(22) Filed: Apr. 14, 2009

(65) Prior Publication Data

US 2009/0262318 A1   Oct. 22, 2009

Related U.S. Application Data

(60) Provisional application No. 61/071,161, filed on Apr. 16, 2008.

(51) Int. Cl.
G03F 7/20       (2006.01)

(52) U.S. Cl.
CPC .................................. *G03F 7/70341* (2013.01)

(58) Field of Classification Search
USPC ........... 355/30, 52, 53, 55, 72–74, 77, 67–71; 250/492.1, 492.2, 492.22, 548; 430/5, 430/8, 22, 30, 311, 312, 321, 322
See application file for complete search history.

(56) References Cited

U.S. PATENT DOCUMENTS

| 4,509,852 A | 4/1985 | Tabarelli et al. |
| 6,867,844 B2 * | 3/2005 | Vogel et al. ..................... 355/30 |

(Continued)

FOREIGN PATENT DOCUMENTS

| CN | 101021693 | 8/2007 |
| CN | 101099224 | 1/2008 |

(Continued)

OTHER PUBLICATIONS

English translation of JP 2001-239187, published on Sep. 4, 2001.*

(Continued)

*Primary Examiner* — Christina Riddle
(74) *Attorney, Agent, or Firm* — Pillsbury Winthrop Shaw Pittman LLP

(57) ABSTRACT

An immersion lithographic apparatus is disclosed that includes a fluid supply system configured to supply a fluid, the fluid supply system having a chamber with a plurality of inlet holes in a first side wall and a plurality of outlet holes in a second side wall, the first side wall facing the second side wall, wherein the inlet holes direct fluid entering the chamber in a direction towards areas of the second side wall between the plurality of outlet holes.

20 Claims, 6 Drawing Sheets

(56) References Cited

U.S. PATENT DOCUMENTS

| | | | |
|---|---|---|---|
| 7,411,654 B2 | 8/2008 | Beckers et al. | |
| 7,474,379 B2 * | 1/2009 | Donders et al. | 355/53 |
| 2004/0136494 A1 | 7/2004 | Lof et al. | |
| 2004/0207824 A1 | 10/2004 | Lof et al. | |
| 2005/0263068 A1 * | 12/2005 | Hoogendam et al. | 118/668 |
| 2005/0280791 A1 * | 12/2005 | Nagasaka et al. | 355/53 |
| 2006/0038968 A1 | 2/2006 | Kemper et al. | |
| 2006/0119809 A1 | 6/2006 | Verhagen et al. | |
| 2006/0158627 A1 | 7/2006 | Kemper et al. | |
| 2006/0221315 A1 * | 10/2006 | Beckers et al. | 355/30 |
| 2007/0110213 A1 * | 5/2007 | Leenders et al. | 378/34 |
| 2007/0243329 A1 * | 10/2007 | De Graaf | 427/256 |
| 2008/0018866 A1 * | 1/2008 | Nagasaka et al. | 355/30 |
| 2008/0231824 A1 * | 9/2008 | Nagasaka | 355/30 |

FOREIGN PATENT DOCUMENTS

| | | | | |
|---|---|---|---|---|
| EP | 1420300 A2 | 5/2004 | | |
| JP | 09108551 A * | 4/1997 | | B01D 71/26 |
| JP | 09-120939 | 5/1997 | | |
| JP | 2001-239187 | 9/2001 | | |
| JP | 2003-318091 | 11/2003 | | |
| JP | 2005-136404 | 5/2005 | | |
| JP | 2005-166999 | 6/2005 | | |
| JP | 2006-060223 | 3/2006 | | |
| JP | 2006-295161 | 10/2006 | | |
| JP | 2007-142428 | 6/2007 | | |
| TW | 200643661 | 12/2006 | | |
| TW | 200707124 | 2/2007 | | |
| WO | 99/49504 A1 | 9/1999 | | |
| WO | 2005/064405 A2 | 7/2005 | | |
| WO | WO 2005104195 A1 * | 11/2005 | | H01L 21/027 |
| WO | 2007/057673 | 5/2007 | | |
| WO | WO 2007055373 A1 * | 5/2007 | | |

OTHER PUBLICATIONS

Japanese Office Action mailed Jul. 12, 2011 in corresponding Japanese Patent Application No. 2009-094473.

Chinese Office Action dated Jan. 5, 2013 in corresponding Chinese Patent Application No. 201110166731.X.

Chinese Office Action dated Jan. 5, 2013 in corresponding Chinese Patent Application No. 201110166687.2.

Vermeulen et al., U.S. Appl. No. 12/388,230, filed Feb. 18, 2009.

* cited by examiner

LITHOGRAPHIC APPARATUS

This application claims priority and benefit under 35 U.S.C. §119(e) to U.S. Provisional Patent Application Ser. No. 61/071,161, entitled "Lithographic Apparatus", filed on Apr. 16, 2008, the contents of that application incorporated herein in its entirety by reference.

FIELD

The present invention relates to a lithographic apparatus for providing a fluid to a space between a projection system of an immersion lithographic apparatus and a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate and/or substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN ('N') onto the substrate, preferably along the direction of movement of the substrate relative to the final element, and is removed by at least one outlet OUT ('T') after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN ('N') on either side of the projection system PL and is removed by a plurality of discrete outlets OUT ('T') arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/119809 in which a member is provided which covers the substrate W in all positions and which is arranged to have immersion liquid extending between it and the top surface of the substrate and/or substrate table which holds the substrate.

SUMMARY

If a flow of fluid in the space between the final end of the projection system and the substrate is provided, this helps ease the difficulties associated with maintaining a substantially constant temperature of the substrate. This is because the projection beam passing through the immersion fluid can heat the immersion fluid. Such heating can have deleterious effects on the imaging. For example, the refractive index of the fluid can change with temperature. Therefore providing a flow of fluid is desirable. However, the introduction of a flow of fluid may itself introduce difficulties. For example, if non-laminar or non-smooth flow is used, this may affect imaging properties. Furthermore or alternatively, if the stability and robustness of the flow deteriorates, bubbles of gas may be entrained in the fluid.

Furthermore, weld lines between an extractor on the bottom surface of a barrier member and the barrier member itself may attract liquid droplets. Droplets may be left behind on the surface of the substrate. Such droplets could later on introduce image defects, for example by introducing bubbles into the space between the final element of the projection system and the substrate.

It is desirable to provide an apparatus in which at least one of the above, or other, problems are alleviated. In particular, it is desirable to provide a fluid supply system which is capable of supplying fluid at a high flow rate whilst maintaining smooth flow, desirably laminar flow. Furthermore, it is desirable to reduce the chances of droplets being attached to the bottom of a barrier member.

According to an aspect of the invention, there is provided an immersion lithographic apparatus comprising a fluid handling system for supplying a fluid, the fluid handling system comprising: a chamber with a plurality of inlet holes in a first side wall and a plurality of outlet holes in a second side wall, the first side wall facing the second side wall, wherein the inlet holes are arranged to direct fluid entering the chamber in a direction towards areas of the second side wall between the plurality of outlet holes.

According to an aspect of the invention, there is provided an immersion lithographic apparatus comprising a fluid handling system for supplying a fluid, the fluid handling system comprising: a first plate with a plurality of through holes for passage therethrough of fluid; and a second plate with a plurality of through holes for passage therethrough of fluid, wherein the first and second plates are substantially parallel and fluid supplied by the fluid handling system is arranged to pass through the plurality of through holes in the first plate prior to passing through the plurality of holes in the second plate.

According to an aspect of the invention, there is provided an immersion lithographic apparatus comprising a fluid handling system for supplying a fluid, the fluid handling system comprising: a flow passageway from an inlet to an outlet; and at least two barriers for flow present in the passageway, each barrier comprising a plurality of through holes for passage of fluid therethrough, the two barriers being separated by between 0.2 and 5 mm.

According to an aspect of the invention, there is provided an immersion lithographic apparatus comprising a fluid handling system for supplying a fluid, the fluid handling system comprising: a chamber with a plurality of inlet holes in a first side wall and a plurality of outlet holes in second side wall, the plurality of inlet holes having a smaller opening dimension than the plurality of outlet holes.

According to an aspect of the invention there is provided an immersion lithographic apparatus comprising a fluid handling system for supplying a fluid through an inlet, the inlet comprising: at least two spaced-apart plate members facing each other and each having a plurality of through holes, wherein for the flow of fluid through the inlet the through holes of one plate member are non-aligned with the through holes of another plate member.

According to an aspect of the invention there is provided immersion lithographic apparatus comprising a fluid handling system for supplying a fluid through an inlet to a space between a projection system and a substrate and/or a substrate table, the inlet comprising a plurality of openings, the inlet configured to supply a smooth fluid flow, into the space, substantially perpendicular to a plane parallel to the inlet, the cross-sectional flow rate of the fluid flow being substantially uniform.

According to an aspect of the invention there is provided an immersion lithographic apparatus comprising a fluid handling system for supplying a fluid through an inlet to a space between a projection system and a substrate and/or a substrate table, the inlet comprising a plurality of openings arranged in a planar surface, the inlet configured to supply a smooth fluid flow, into the space, substantially perpendicular to a plane parallel to the inlet, the cross-sectional flow rate of the fluid flow being substantially uniform.

According to an aspect of the invention there is provided method of manufacturing a device, the method comprising: confining immersion liquid in a space defined between a projection system, a substrate and/or substrate table, a fluid handling structure, and a meniscus of immersion liquid which extends between the fluid handling structure and the substrate and/or substrate table, the projection system arranged to project a beam of patterned radiation onto an imaging field at a target portion of the substrate and the substrate table arranged to support the substrate, and causing relative motion between the projection system and the substrate and/or substrate table so that on a change of direction of the relative motion, a liquid droplet formed on the surface of the substrate and/or the substrate table has a displacement relative to an end of the imaging field in a lengthwise direction larger than a length of the imaging field.

According to an aspect of the invention there is provided an immersion lithographic apparatus comprising a substrate table for supporting a substrate; a fluid handling structure constructed and arranged to confine immersion liquid in a space defined between a projection system for projecting a beam of patterned radiation onto an imaging field at a target portion of the substrate, a substrate and/or a substrate table, and, in use, an immersion liquid meniscus which extends between the fluid handling structure and the substrate table and/or the substrate; and an actuator configured to cause relative motion between the projection system and the substrate and/or substrate table, so that on a change of direction of the relative motion a liquid droplet on the surface of the substrate and/or the substrate table has a displacement relative to an end of the imaging field in a lengthwise direction larger than a length of the imaging field.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
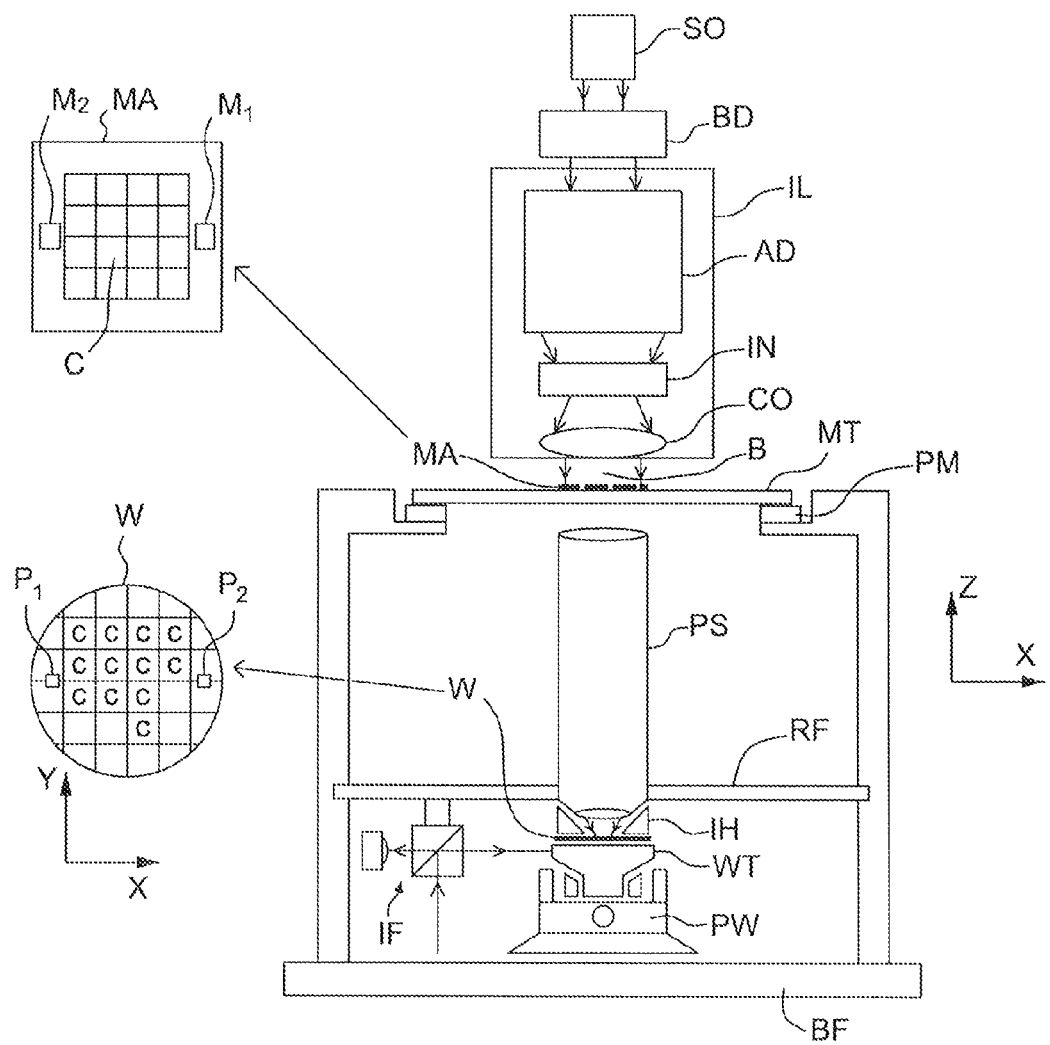
FIG. 1 depicts a lithographic apparatus according to an embodiment of the invention.
Figure 2:
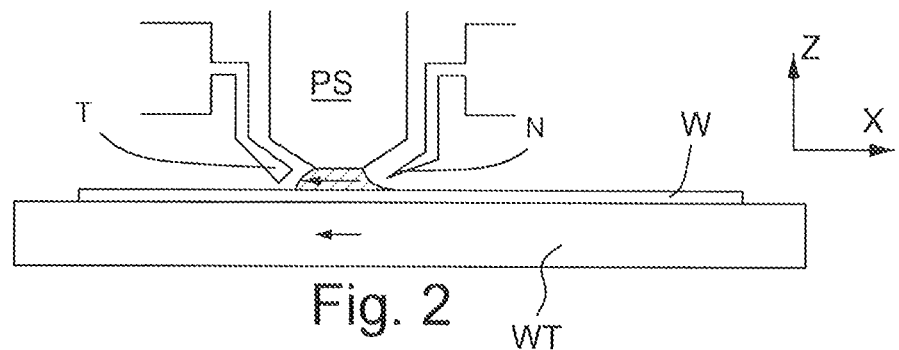
FIGS. 2 and 3 depict a liquid supply system for use in a lithographic projection apparatus.
Figure 3:
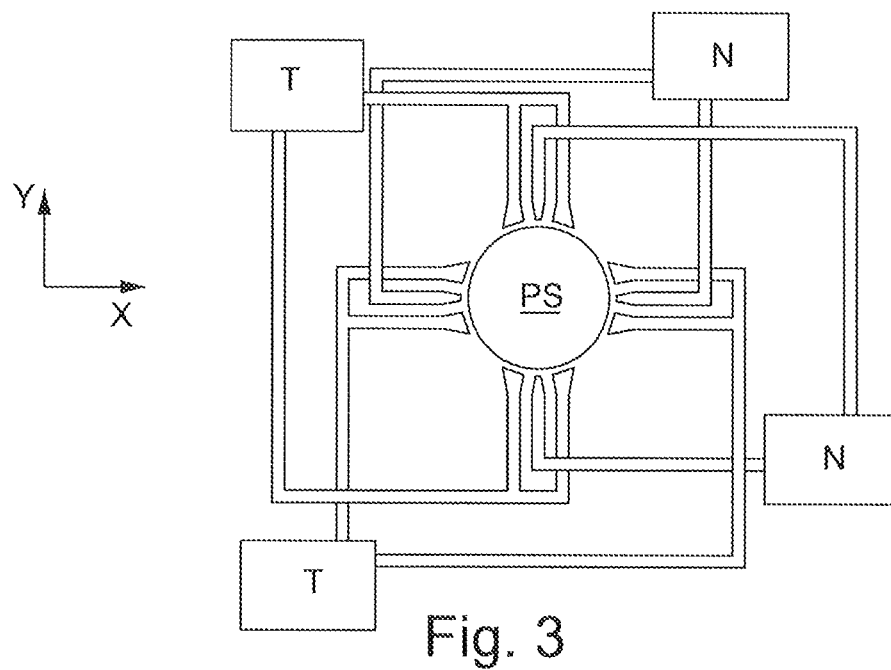
Figure 4:
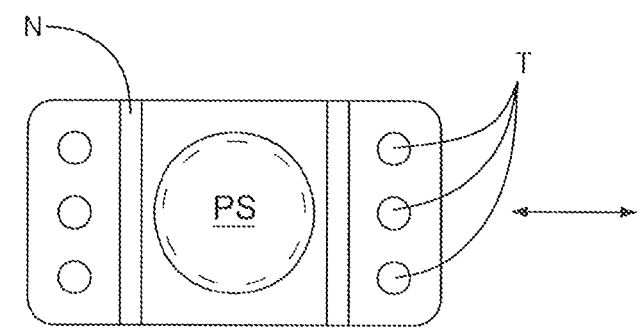
FIG. 4 depicts a further liquid supply system for use in a lithographic projection apparatus.
Figure 4:
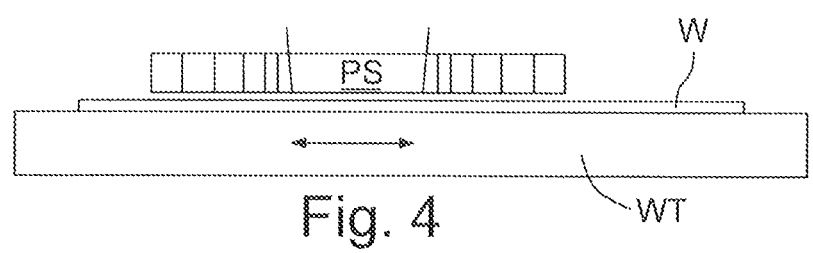

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system in which liquid is substantially only provided to a localized area of the substrate. In the latter category, the space filled by liquid is smaller in plan than the top surface of the substrate and the area filled with liquid remains stationary relative to the projection system PS while the substrate W moves underneath that area. A further arrangement, to which an embodiment of the present invention is mainly directed, is the all wet solution in which the liquid is unconfined. In this arrangement, substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 can also be used in such a system; however, their sealing features are not present, are not activated, are not as efficient as normal or are otherwise ineffective to seal liquid to only the localized area. Four different types of localized liquid supply systems, or liquid handling systems, or liquid confinement systems, are illustrated in FIGS. 2-5. The liquid supply systems disclosed in FIGS. 2-4 were described above.

Figure 5:
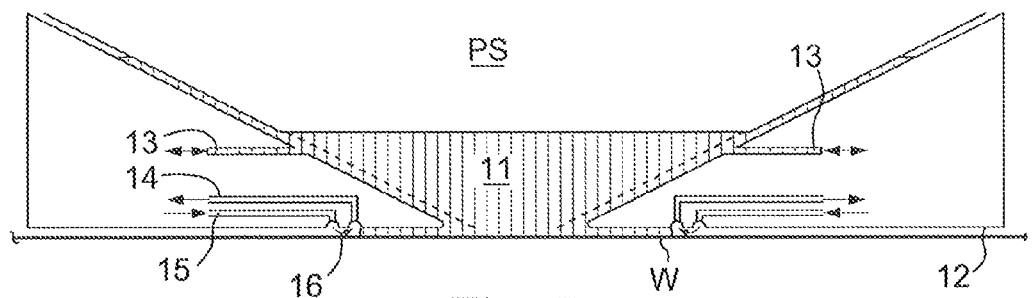
FIG. 5 depicts, in cross-section, a barrier member which may be used in an embodiment of the present invention as a liquid supply system.

FIG. 5 schematically depicts a localized liquid supply system with a barrier member 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a gas seal or fluid seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. Relative movement of that part of the liquid supply system and the substrate W may lead to breakdown of the seal and thereby leaking of liquid. The problem may be more significant at high scan velocities. An increased scan velocity is desirable because throughput increases.

Figure 6:
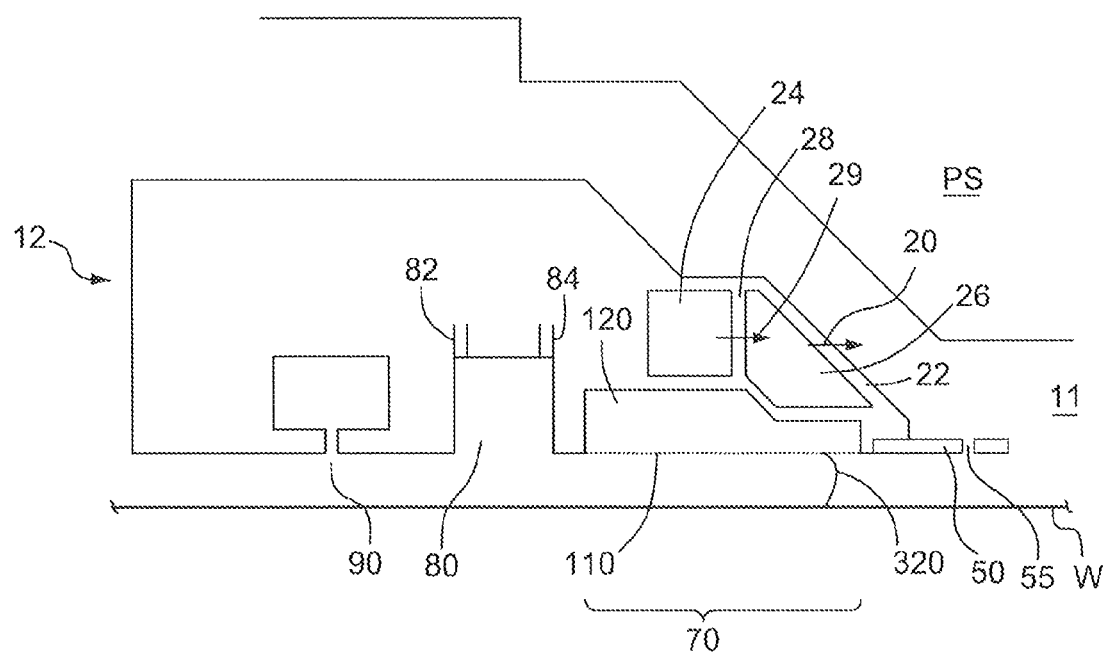
FIG. 6 illustrates, in cross-section, another barrier member which may be used in an embodiment of the present invention.

FIG. 6 illustrates a barrier member 12 which is part of a liquid supply system. The barrier member 12 extends around the periphery (e.g., circumference) of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier could also be other shapes so long as it has an opening through which the projection beam may pass out from the final element of the projection system PS. The opening may be centrally located. Thus during exposure the projection beam may pass through liquid contained in the opening of the barrier member and onto the substrate W. The barrier member 12 may be, for example, substantially rectangular and is not necessarily the same shape as the final element of the projection system PS is at the height of the barrier member 12.

The function of the barrier member 12 is at least partly to maintain or confine liquid in the space between the projection system PS and the substrate W so that the projection beam may pass through the liquid. The top level of liquid is simply contained by the presence of the barrier member 12 and the level of liquid in the space is maintained such that the liquid does not overflow over the top of the barrier member 12.

The immersion liquid is provided to the space 11 by the barrier member 12. A passageway or flowpath for immersion liquid passes through the barrier member 12. Part of the flowpath is comprised by a chamber 26. The chamber 26 has two side walls 28, 22. Liquid passes through the first side wall 28 into chamber 26 and then through the second side wall 22 into the space 11. A plurality of outlets 20 provide the liquid to the space 11. The liquid passes through through holes 29, 20 in plates 28, 22 respectively prior to entering the space 11. The location of the through holes 20, 29 may be random. An embodiment of the invention, as is described below, is directed to an optimum arrangement of through holes 20, 29 in plates or side walls 28, 22 to the chamber 26. Before describing the optimum arrangement of side walls 22, 28 and through holes 20, 29 below, a description of other components of the barrier member 12 will be given. It will be understood that other arrangements are possible.

A seal is provided between the bottom of the barrier member 12 and the substrate W. In FIG. 6 a seal device is configured to provide a contactless seal and is made up of several components. Radially outwardly from the optical axis of the projection system PS, there is provided a (optional) flow plate 50 which extends into the space (though not into the path of the projection beam) which helps maintain substantially parallel flow of the immersion liquid out of outlet 20 across the space. The flow control plate has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an extractor assembly 70 to extract liquid from between the barrier member 12 and the substrate W and/or the substrate table WT. The extractor 70 will be described in more detail below and forms part of the contactless seal which is created between the barrier member 12 and the substrate W. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. Radially outwardly of the recess 80 may be a gas knife 90. An arrangement of the extractor, recess and gas knife is disclosed in detail in United States patent application publication no. US 2006/0158627. However, in that document the arrangement of the extractor assembly is different.

The extractor assembly 70 comprises a liquid removal device or extractor or inlet such as the one disclosed in United States patent application publication no. US 2006-0038968, incorporated herein its entirety by reference. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 70. However, when the porous surface 110 comes into contact with liquid there is no meniscus to restrict flow and the liquid can flow freely into the chamber 120 of the liquid removal device 100. The porous surface 110 extends radially inwardly along the barrier member 12 (as well as around the space). The rate of extraction through the porous surface 110 varies according to how much of the porous material 110 is covered by liquid.

During scanning of the substrate W (during which the substrate moves under the barrier member 12 and projection system PS) the meniscus 320 extending between the substrate W and the barrier member 12 can be drawn either towards or away from the optical axis by a drag force applied by the moving substrate. This can lead to liquid loss which may result in: evaporation of the liquid, cooling of the substrate, and consequent shrinkage and overlay errors as described above. Liquid stains may also or alternatively be left behind from interaction between the liquid droplets and resist photochemistry.

The porous material 110 has a large number of small holes each with a dimension, e.g. a width, such as a diameter, $d_{hole}$ in the range of 5 to 50 µm, and is maintained at a height in the range of 50 to 300 µm above a surface from which liquid is to be removed, e.g. the surface of a substrate W. In an embodiment, porous material 110 is at least slightly hydrophilic, i.e. having a contact angle of less than 90° to the immersion liquid, e.g. water.

It may not always be possible to prevent gas being drawn into the liquid removal device but the porous material 110 will prevent large uneven flows that may cause vibration. Microsieves made by electroforming, photoetching and/or laser cutting can be used as the porous material 110. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

Although not specifically illustrated in FIG. 6, the liquid supply system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery (e.g., circumference) of the barrier member 12 during movement of the barrier member 12 relative to the projection system PS. In an alternative or additional arrangement, liquid may be removed from the top of the barrier member 12 using, for example, an extractor such as a single phase extractor similar to the extractor 70. An alternative or additional feature is a liquidphobic or hydrophobic coating. The coating may form a band around the top of the barrier member 12 surrounding the opening and/or around the last optical element of the projection system PS. The coating may be radially outward of the optical axis of the projection system. The liquidphobic or hydrophobic coating helps keep the immersion liquid in the space.

A difficulty with a localized area liquid supply system is that it is difficult to contain all of the immersion liquid. Thus, avoiding leaving some liquid behind on the substrate as the substrate moves under the projection system is difficult. In order to avoid liquid loss, the relative speed at which the substrate moves under the liquid supply system should be limited due to potential bubble entrapment at the advancing meniscus. This is particularly so with an immersion liquid capable of generating a high value of NA in the immersion lithography apparatus because it tends to have a lower surface tension than water as well as a higher viscosity. Breakdown speed of a meniscus scales with surface tension over viscosity so that a high NA liquid may be far harder to contain. Leaving liquid behind on the substrate in only certain areas of the substrate may lead to temperature variations throughout the substrate. Evaporation of the immersion liquid cools the substrate on which the liquid is located. Immersion liquid left behind on parts of the substrate causes uneven cooling and substrate deformation. Overlay errors may result. Also or alternatively, as the immersion liquid evaporates, it is possible that a drying stain and/or contaminating particles may be left behind on the substrate W surface. Also or alternatively, the liquid may diffuse into the resist on the substrate leading to inconsistencies in the photochemistry of the top surface of the substrate.

Although a bath type arrangement (i.e. where the substrate is submerged in a container of liquid) may alleviate many of these problems, substrate swap in the immersion apparatus may be particularly difficult with a bath type solution. One way to alleviate one or more of these problems, or other problem not mentioned here, is to use a so-called all wet solution in which the whole of the top surface of the substrate is covered in liquid (i.e. the liquid is unconfined on the substrate and/or substrate table). This type of arrangement is disclosed, for example, in U.S. provision application No. 61/064,126, filed 19 Feb. 2008.

All of the above types of arrangements provide liquid in a space between the final end of the projection system and the substrate. Desirably the flow of liquid through the space reduces or avoids the undue influence of the irradiating beam passing through the liquid, for example, in increasing the temperature of the liquid through which the beam passes. An embodiment of the invention is directed to increasing the flow rate between the projection system and the substrate whilst maintaining smooth, desirably, laminar flow. The flow may be smooth turbulent flow. In an embodiment, the flow is stable which is more robust to manufacturing issues. A greater refresh rate and temperature stability and system performance may be achievable. Therefore an embodiment of the invention can be applied to any of the arrangements for providing liquid between the projection system and the substrate and/or substrate table. An embodiment of the invention will be in particular described with relation to the localized area liquid supply system of FIG. 6. However, this is not intended to be limiting to only this type of application.

A further or alternative reason for maintaining smooth, desirably laminar flow is to avoid bubble entrapment. Non-smooth turbulent flow may disturb, for example, the meniscus between the barrier member 12 and the projection system PS. Disturbing this meniscus may result in gas enclosure in the immersion liquid. The flow then transports such enclosed gas as bubbles into the space between the final element of the projection system PS and the substrate W. These bubbles refract the exposure radiation in dark stripes in the exposed pattern. Therefore it is desirable to maintain smooth, desirably laminar flow.

Figure 7:
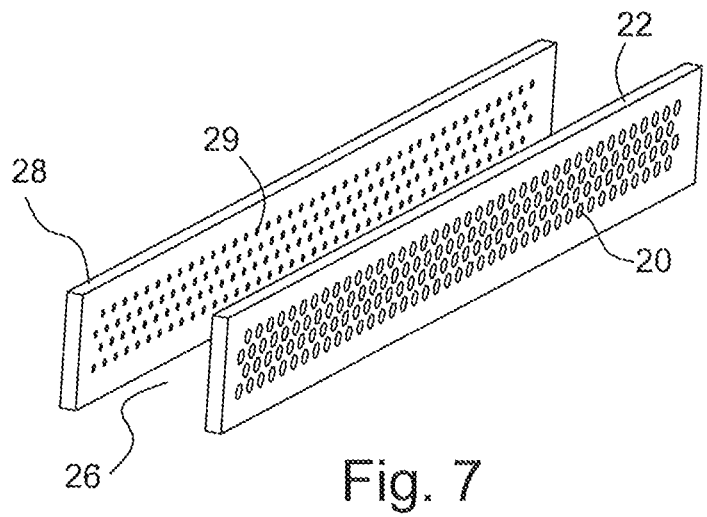
FIG. 7 illustrates a perspective view of two side walls or plates of a liquid supply device of an embodiment of the invention.

In an embodiment of the invention the side walls formed as plates 28, 22 of the chamber 26 are arranged to be substantially parallel as is illustrated in FIG. 7. That is a major surface of each plate 28, 22 is substantially parallel, and more specifically, the major surface of each plate is a plane and these planes are substantially parallel. This is done primarily to aide in aligning the two plates as is described below. Further, in an embodiment, the plates 28, 22 are substantially co-planar in a plane substantially perpendicular to the main surfaces of plates 28, 22. Further, the optical axis of the projection system PS may be substantially co-planar with the plates 28, 22 in the plane substantially perpendicular to the main surfaces of plates 28, 22.

In an embodiment, the through holes 20, 29 in the two plates 22, 28 respectively have the same two-dimensional pattern. However, different patterns can be used and even an irregular pattern or a pattern with unequally spaced holes can be used. In the illustrated pattern the holes are spaced apart, desirably equidistantly, along a horizontal first row. Holes are spaced apart, desirably equidistantly, along the adjacent rows (above and below the first row). However, the holes of the adjacent rows are positioned out of phase with respect to the holes along the first row. That is, the holes in the adjacent rows are positioned equidistantly in the horizontal direction between the holes of the first rows. The same arrangement applies if described in terms of spacing the holes along vertical columns. Considering this pattern with respect a hole and its six surrounding holes (four positioned along the four diagonals of the hole and one each positioned horizontally on each side of the hole) an (elongate) hexagonal pattern is described. The hole is in the centre of the elongate hexagon, which viewed in this way is horizontally elongate. Put another way, holes located vertically either side of the considered hole may be considered to mark out the elongate hexagon instead of the horizontally located holes. In an embodiment, the spacing in the hole patterns of each of the plates 22, 28 is the same. However, the size of the holes 29 in the first plate 28 are not necessarily the same size as the holes 20 in the second plate 22.

It is desirable to have a larger or equal pressure drop of liquid over the first plate 28 compared to the pressure drop over the second plate 22. This results in a reduction in flow inhomogeneity by the action of the first plate 28. The second plate 22 acts to avoid non-smooth turbulent flow. Therefore the holes 29 in the first plate 28 have an equal size or have a smaller width (e.g., diameter) than the holes 20 in the second plate 22. The separation of the two plates 28, 22 may have an effect and this will be described in more detail below.

Figure 8A:
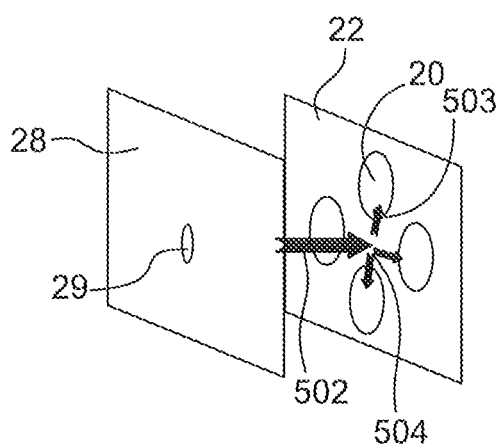
FIGS. 8a and b illustrate schematically the arrangement of holes in one plate with respect to the holes in the other plate.
Figure 8B:
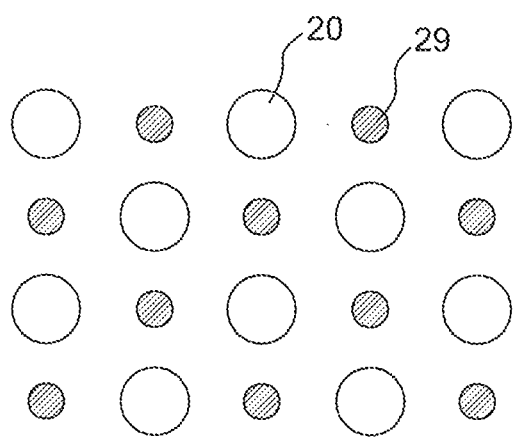

FIGS. 8a and 8b illustrate how the two plates 28, 22 and in particular the holes 29, 20 in the plates are aligned. The view in FIG. 8a is a schematic perspective view. FIG. 8b is a schematic view illustrating a side elevation of the two plates with through holes (which can be called sieves). In FIG. 8b the pattern of the holes 29 in the first plate 28 is shown with the pattern of the holes 20 of the second plate 22 superimposed on top.

FIG. 8a shows the direction of liquid flow through a through hole 29 in the first plate 28 as an arrow 502. As can be seen, because of the alignment of through hole 29 the liquid flow 502 impinges at a point 504 on the surface of the second plate 22 rather than over a through hole 20. In fact, the desirable alignment which is illustrated in FIG. 8b means that the flow of liquid 502 through a through hole 29 impinges on the surface of the second plate 22, or wall, at a position 504 equidistant from the surrounding through holes 20 defined in the plate 22. As a result the liquid flow 502 from the through hole 29 between the plates 28, 22 breaks on impact with surface of the plate 22. The liquid flows in further flows 503, generally orthogonal to the liquid flow 502. The further flows 503 may be parallel to the surface of the second plate 22 and may be towards the holes 20 defined in the second plate 22.

The through holes 29 in the first plate 28 (which can be seen as inlet holes into chamber 26) direct liquid entering the chamber 26 in a direction 502 towards areas of the second plate 22 between the plurality of holes 20 in the second plate 22. The holes 20 in the second plate 22 can be seen as outlet holes into the space 11 between the projection system and the substrate. The holes 20 of the second plate 22 are not aligned with the holes 29 of the first plate 28. The plurality of holes 29 of the first plate 28 are defined so that they do not overlap with the holes 20 of the second plate 22.

The arrangement is effective to disrupt the flow of liquid through the inlet holes 29 and means that the resulting flow out of the chamber 26 through outlet holes 20 into the space 11 may be higher than previously achieved. The resulting liquid flow into the space 11 is smooth and stable. Desirably the flow is laminar. To achieve this, the first plate 28 serves to reduce cross-sectional profile flow rate inhomogeneities by a diffusing function. The created jets, indicated by arrow 502, have a high linear momentum in a direction perpendicular to the surface of the first plate 28 and for the second plate 22. The jet of liquid interacts with a portion 504 of a surface of the second plate 22. The portion 504 of the second plate 22 disrupts the flow of the jets, reducing the perpendicular component of the linear momentum by redirecting the flow in a direction orthogonal to the jets. The bulk flow of liquid is substantially parallel to the surface of the second plate 22. The bulk flow is in all directions away from the portion 504. The flow of liquid approaching a hole 20 is thus not unidirectional and may be substantially parallel to the plane of the plate 22. As the portion 504 is in between a number of holes defined in the surface of the second plate 22, the liquid flows towards each of these holes 20. There are many portions 504 on the surface of the second plate, and the same interaction occurs at each of the portions 504 each causing flow to the holes 20 surrounding each portion 504. So the flow approaching a hole 20 in the second plate 22 is substantially orthogonal to the bulk flow of liquid flowing through the second plate 22 into the space 11. The resulting flow of liquid into the space is as a smooth flow and may be laminar.

The improvement in performance that may be afforded by this arrangement varies with the separation between the plates 28, 22 as well as the phase shift between the two patterns. The phase shift in FIG. 8b can be regarded as being exactly out of phase (designated a phase shift of 0.5). If the two patterns are superimposed one on top of the other then this can be regarded as being in phase (designated a phase shift of 0.0). The effect of the phase shift and the separation between the two plates will be described below with reference to FIGS. 10 and 11.

It is desirable to provide a uniform pressure distribution over the entire length and/or width of the plate 22. So the cross-sectional flow over the inlet is substantially uniform. If the pressure drop is uneven then this can result in an unstable and non-uniform velocity profile of liquid. Such a flow may have an asymmetric velocity profile in the reservoir. A pressure drop is achieved by forcing a liquid through a hole. Therefore there is a pressure drop over the first plate 28 as well as over the second plate 22. The pressure drop over the first plate 28 can be controlled to be larger than the pressure drop over the second plate 22 by making the holes 29 in the first plate 28 smaller than the holes 20 in the second plate 22. For example, a pressure drop of about 75 mbar over the first plate and a pressure drop of only 5-10 mbar over the second plate 22 is desirable. If the same pattern is used then the holes in the first plate 29 typically have a size of between 100 and 300 μm. By contrast, the holes in the second plate 22 have a size of between 300 and 700 μm. The holes are separated by between 100-200 μm in the first plate 28 and by between 300-500 μm in the second plate 22.

The thickness of the plates is of the order of between 0.3 mm and 1 mm. The through holes or liquid outlets 20, if formed in a barrier member 12 such as illustrated in FIG. 6, are desirably provided around only a localized part of the periphery (e.g., circumference) of the barrier member 12. Opposite the outlet 20, for example defined in the opposing side of the barrier member 12 defining the space, could be an extractor to remove liquid from between the projection system and the substrate and/or substrate table. The liquid inlets 20 may only extend along a fraction of the periphery (e.g., circumference) of the barrier member.

Figure 11:
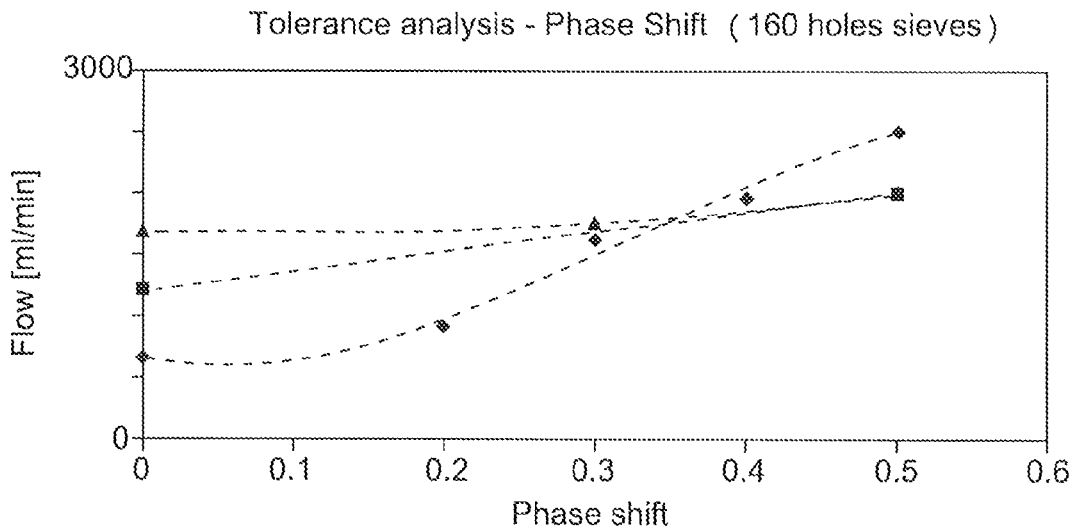
FIG. 11 is a graph showing maximum flow rate without turbulence for different phase shifts.

For a given design of plates 22, 28 and pattern of holes 20, 29, phase shift and plate separation, the flow of liquid through the assembly may result in smooth flow, desirably laminar flow, up to a certain flow rate at which point unstable turbulent flow ensues. It is desirable to have as high a flow rate across the space 11 as is possible. The highest flow rate may be achievable with the plates positioned exactly out of phase (as illustrated in FIG. 11a) and the distance between the plates 28, 22 being as low as possible. However if the distance becomes too small, then the tolerance in the phase shift may become critical. Therefore a separation of the two plates of between 0.5-3 mm, e.g., between 2-3 mm is desirable. In an embodiment, the separation is between 0.7 and 1.5 mm. Ideally the phase shift is such that the patterns of holes are exactly out of phase (i.e. a phase shift of 0.5). However, improvements are seen for any degree of phase shift. Therefore a range of phase shift of between 0.2 and 0.5, desirably above 0.4, may be particularly desirable (with out of phase being 0.5 and in phase 0—see below with regard to FIG. 11).

Having the plates 28 and 22 at close proximity reduces the chances of jets from adjacent holes interfering, or the liquid from a jet flowing straight through a hole 20 defined in the second plate 22. It substantially reduces, and desirably minimizes, the velocity of the liquid perpendicular to the first plate 28 gained from passing through the hole 29 before passing through the second plate 22.

In an ideal arrangement, the distance between the plates 28, 22 tends to zero. In such an arrangement, the flow of liquid is parallel to the surfaces of the plates 28, 22. The flow towards a hole 20 in a plane parallel to the second plate 22 (as described above), is from all directions. The net flow rate at the middle of the hole perpendicular to the surface of the second plate, just before the liquid passes through the hole, is zero. Thus the bulk flow rate of the liquid just before it passes through a hole 20 is zero.

The arrangement of an embodiment of the invention causes the flow out of a hole 20 to function as a point source liquid supply. The liquid flow through each hole 20 is intended to be the same as the flow through each of the other holes 20 defined in the plate 20. The holes are also evenly distributed over the surface of the plate 22, and thus the inlet. Thus, the liquid flow from the plurality of holes in the plate is uniform across the plate. The inlet functions as a plurality of point source liquid sources, supplying a liquid flow having a substantially uniform liquid cross-sectional liquid flow rate. The arrangement is beneficial, because it maintain the cross-sectional flow rate at high liquid flow velocities.

Figure 9:
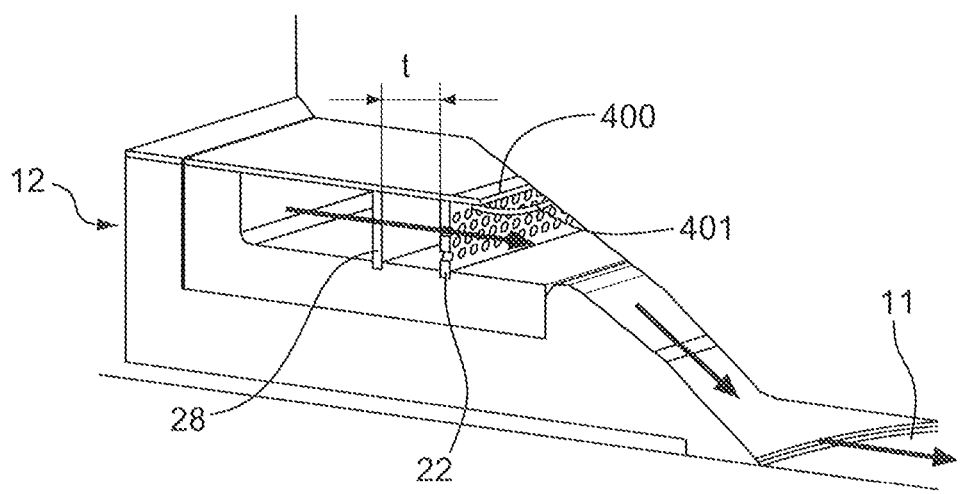
FIG. 9 illustrates in a perspective cut-away view how the plates of FIG. 7 are assembled into a barrier member.

FIG. 9 is a cut away perspective view of how the assembly of FIGS. 7 and 8 could be incorporated into a barrier member 12. None of the sealing features on the bottom of the barrier member 12 are illustrated. This is because they may or may not be present and can take any form. As can be seen, the outlets 20 are positioned at a height above the bottom of the final element of the projection system. Therefore the flow which comes out of the outlet 20 changes direction due to the presence of the projection system PS to flow with a component downwards towards the space 11 between the final element of the projection system and the substrate W. When the liquid flow reaches the level of the space 11, it changes direction to flow parallel to the top surface of the substrate W.

As can be seen, the plates 22, 28 are substantially parallel. Furthermore, both plates are substantially parallel with an optical axis of the projection system PS. In an embodiment, the holes in the first and/or second plate are drilled to have an axis in a plane perpendicular to the optical axis of the projection system. Those planes in which the holes 20 are situated are at a height such that they cut through the projection system PS. That is, those planes are above the bottom of the projection system.

As can be seen in FIG. 9, a projection 400 desirably in the form of a lip is present. The projection 400 is situated above the second plate 22 and extends radially inwardly (i.e. towards the side of the projection system). In an embodiment, the projection 400 is substantially horizontal. The projection allows a meniscus 401 to extend between the end of the projection 400 and the projection system PS. The projection reduces the distance between the top of the barrier member 12 and the projection system PS therefore to shorten the distance spanned by the meniscus and in that way stabilizes the meniscus. A stable meniscus helps to prevent the flow sucking in gas from above the barrier member 12 and thereby enclosing bubbles into the liquid.

Figure 10:
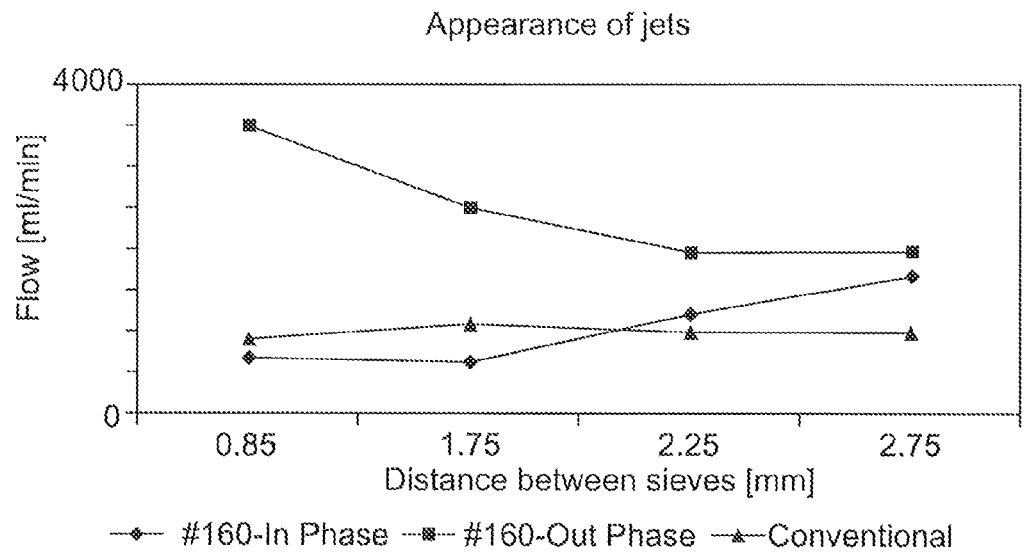
FIG. 10 is a graph showing the variation in maximum flow rate without introduction of turbulence versus distance between plates for three different designs.

FIG. 10 illustrates, for three different configurations, the effect on the distance between the plates 20, 28 (illustrated as distance t in FIG. 9). In FIG. 10 the distance between the plates is plotted along the X axis and the maximum achievable smooth flow, desirably without turbulence and desirably a stable meniscus, is illustrated along the Y axis. The results illustrated with triangles are for a conventional system. It can be seen that varying the distance between the plates has substantially no effect.

The results indicated with diamonds are for a system in which the patterns of holes 29 in the first plate 28 are in phase with the holes 20 in the second plate 22 (i.e. a phase shift of 0.0). In this case the further the plates are spaced apart the higher the achievable lamina flow rate. This is because with increased distance between the plates the jets created by the holes in the first plate substantially interfere with each other before they reach the second plate and with the second plate. With increased distance between the plates the less likely the jets are to pass straight through from the holes of the first plate to the holes of the second plate.

The results illustrated with squares are for a case where the pattern of holes 29 in the first plate 28 are out of phase with the pattern of holes 20 in the second plate 22 (a phase shift of 0.5). As can be seen, the shorter the distance between the two plates, the higher the achievable smooth, stable and desirably laminar flow.

FIG. 11 shows along the X axis the phase shift between the two plates 22, 28 and along the Y axis the maximum achievable smooth flow, desirably without turbulence and desirably with a stable meniscus. As can be seen, for all examples tested (various distances t: triangles having t=2.75 mm; squares having t=2.25 mm; diamonds having t=1.75 mm) the closer to a phase shift of 0.5 the two patterns of holes in the two plates 22, 28, the higher the achievable flow.

The results in FIG. 11 illustrate that for a lower separation t (indicated by diamonds) the improvement in flow achievable by changing from a phase shift of 0 to 0.5 is more marked than the effect of changing from a phase shift of 0 to 0.5 for a larger separation t. However, for all separations t, a phase shift of 0.5 achieves better results than a phase shift of 0.0.

Bubbles may be introduced into the immersion space by collision of the meniscus 320 between the barrier member 12 and the substrate W with liquid droplets left behind on the substrate W. When such a droplet collides with the meniscus 320, gas inclusion can occur. Typically this happens if the sum of the static contact angle of the droplet and the advancing contact angle of the meniscus is greater than 180°. Two mechanisms have been identified. The first mechanism is to do with the build up of liquid on the barrier member on areas radially outwardly of the single phase extractor 70. This can occur from earlier collapse of the meniscus 320 or crossing the gap between the substrate table WT and the substrate W. This mechanism is dealt with by the embodiment of FIG. 12. The second mechanism is due to liquid build up inside the gas knife 90 from a previous scan motion. This is dealt with by dimensioning the gas knife or the position of the meniscus according to the equations described in conjunction with FIGS. 13 and 14. The gas knife may collect liquid that has otherwise escaped from the space 11 and meniscus 320. On a change of a relative direction of movement between the barrier member and the substrate W, a droplet may detach from the barrier member (e.g., at weld) to join other escaped droplets on the surface of the substrate. After change in direction, the droplets are stationary on the surface of the substrate but may be moving towards the meniscus 320. The droplets can impinge on and so collide with the meniscus 320, causing the inclusion of bubbles into the liquid, undesirably within the space 11 between the projection system PL and the substrate W to affect imaging quality.

The features provided on the bottom of a barrier member or liquid confinement system 12 in order to seal liquid into the space 11 may be welded in place. A single phase extractor comprising a porous member 110 may be used. The porous member 110 may cover a chamber 120 which is held at an under pressure. The porous member 110 may be welded over a recess formed in the bottom of the barrier member 12. The recess defines the chamber 120. This is illustrated in FIG. 6. The porous member 110 is welded along its radially inward and outward peripheries (e.g. circumference) to the surface of the barrier member 12. In some instances a droplet of immersion liquid can attach itself to such a weld. It may be very difficult to remove liquid from such a position. The gas knife 90 positioned radially outwardly of the single phase extractor 70 may be ineffective for this purpose.

Figure 12:
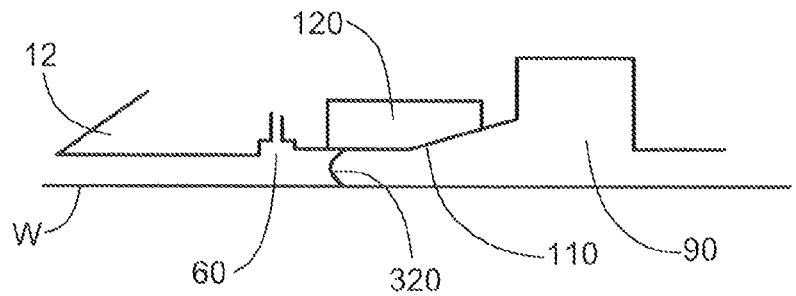
FIG. 12 illustrates, in cross-section, the undersurface of a barrier member of an embodiment of the present invention.

FIG. 12 shows, in cross-section, the bottom surface of a barrier member 12 which helps to alleviate this problem. The features on the bottom surface are similar to those in FIG. 6. Radially most inwardly is a liquid inlet 60 to provide a liquid to the space between the barrier 12 and the substrate W. Radially outwardly of the liquid inlet 60 is a single phase extractor including a porous member 110. The porous member 110 covers a chamber 120 held at an under pressure. Radially outwardly of the extractor is an outlet for a gas knife 90. Other arrangements of components are also possible, for example the extractor may be a dual phase extractor.

What is at issue is the bottom surface of the porous member 110 is not planar. As can be seen from FIG. 12, the porous member 110 has a portion which is angled with respect to the substrate W. In a radially outward direction, the displacement between the surface of the porous member 110 and the substrate W increases. The change with radial distance in the distance of the surface of the porous member 110 from the surface of the substrate W is smooth, may be continuous and may be linear. In particular, the change in angle illustrated in FIG. 12 is a smooth change and is not pointed, i.e. discontinuous. The angle of the porous member 110 relative to the substrate W changes in a continuous manner. For example, if the porous member is formed as is illustrated in FIG. 12, there is a radius on the portion where the surface of the porous member 110 changes from being parallel to non-parallel with respect to the surface of the substrate W. The surface of the porous member changes from one region where it is parallel to the surface of the substrate W to a region in which it is angled away from the surface of the substrate W. The surface of the porous member in between these two regions may be curved. The radius of curvature at that portion could, for example, be between 1 and 10 mm, or between 3 and 7 mm, for example a 5 mm radius.

The radius of curvature can depend upon the exact dimensions of the porous member 100. In particular, the radius can depend upon the width of the porous member. That is, on the difference between the inner diameter and the outer diameter of the porous member. Typically this might be about 10 mm. The radius can be as low as 0.01 times the width of the porous member. A range of radius from 0.005-10 times the width of the porous member is possible. If the distance between the top surface of the substrate and the bottom surface of the inner portion of the porous member is denoted as h, the furthest distance of the porous member from top surface of the substrate (at the outer edge) can typically between 5 and 10 times h. The change in distance from the top surface of the substrate typically starts about half way along the width of the porous member.

An advantage of this arrangement is that the meniscus 320 which extends between the substrate W and the barrier member 12 should remain positioned somewhere along the portion of the porous member 110 which is parallel to the top surface of the substrate W. A problem that a liquid droplet could remain at the weld between the porous member 110 and the bottom surface of the barrier member 12, particularly at the outer edge (desirably the outermost edge), is thereby alleviated. Otherwise, liquid could adhere, for example, to a weld at this outer edge and be very difficult to move. The gas knife 90 would sweep up any liquid which does get past the porous member 110 and that liquid could then sit on the weld. By elevating the outer weld edge of the porous member 110 (by between 0.5 and 2 mm, desirably 1 mm compared to the inner edge) it can help prevent a liquid droplet from adhering to the weld and thereby the problem can be addressed. The portion of the porous member 110 parallel to the top surface of the substrate W is approximately 2 mm long. Any droplets which come in contact with the porous member 110 along this part will be extracted. So, as a droplet detached from the weld or collected by the gas knife 90 approaches the porous member 110 after a change in relative movement between the projection system PL and the substrate W, the droplet contacts the porous member 110 and is extracted before it contacts the meniscus 320 to cause a bubble inclusion.

Note, the presence of liquid at the inner weld between the porous member 110 and the barrier member 12 is not a problem because liquid will be there under normal operation in any case.

Figure 13:
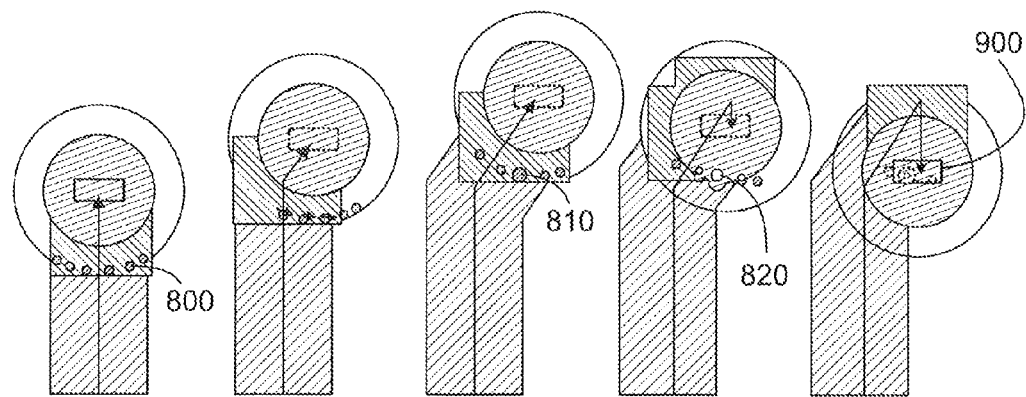
FIG. 13 illustrates a first bubble inclusion scenario.
Figure 14:
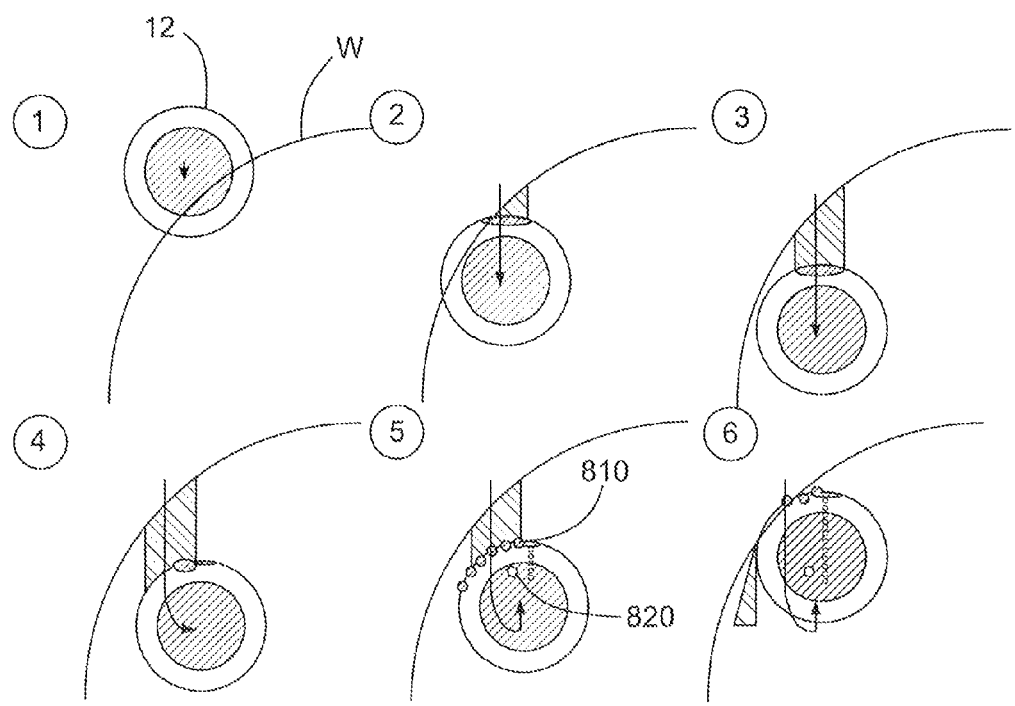
FIG. 14 illustrates a second bubble inclusion scenario.

FIGS. 13 and 14 illustrate two possible mechanisms for the formation of droplets which form bubbles in the liquid in the space 11 on impact with the meniscus 320. Using the knowledge of these two possible mechanisms it is possible to tune the parameters of imaging (e.g. scan speed, acceleration, settle time, barrier member size, routing of the substrate under the projection system, etc.) to place any bubbles which are formed outside of the image field. An actuator and a controller to control the actuator of the substrate table is used for this purpose. The controller comprises a processor and a memory.

By reducing scan speed and settle time together, the impact on system throughput can be minimized. Similarly, the width (e.g., diameter) of the gas knife 90 in the barrier member 12 can be chosen according to substrate table parameters.

A first scenario is illustrated in FIG. 13. Any liquid which does get past the single phase extractor is caught by the gas knife 90. Thus, droplets of liquid 800 are caught in the trailing portion of the gas knife 90. When the direction of movement of the substrate table WT changes, the liquid droplets 800 are swept together to form one or more larger droplets 810. If the stage supporting the substrate table WT is moved such that the meniscus 320 hits such a large liquid droplet 810, a gas bubble 820 may be formed within the liquid. The larger the droplet 810, the larger the gas bubble 820 formed. The bubble 820 may migrate into the space 11. For a small droplet, a produced gas bubble quickly dissolves before it reaches the exposure slit 900. However, for larger bubbles these will not dissolve and may still be present when they reach the exposure slit 900. The presence of a bubble in the exposure slit 900 will result in imaging defects.

Whether a bubble will exist in the exposure slit 900 can be approximated by the following equations:

$$SSA \cong \frac{1}{2} \cdot \frac{v}{a} + v \cdot \tau + \frac{Y_{slit}}{2}$$

$$y = \frac{D_{AK}}{2} - SSA \pm \Delta y$$

SSA Length of step, settle and acceleration move in scanning direction
v Scan speed in scanning direction
a Stage acceleration in scanning direction
τ Settle time after acceleration
$Y_{slit}$ Width of the exposure slit (determined by 95% intensity profile)
$D_{AK}$ Diameter of the gas knife
Δy Spread of bubbles
y Position of the droplet in the field If the position of the droplet is calculated to be outside of the field (taking into account spread) the bubble will be generated outside the image and will therefore not result in a defect. That is, if y is larger than the field in the y direction, the droplet will not be in the field.

The mechanism illustrated in FIG. 13 is the result of liquid escaping from the single phase extractor due to too high a scan speed. A similar event can happen when the edge of a substrate W is imaged. This is illustrated in FIG. 14. When the edge of the substrate W passes under the barrier member 12, the meniscus 320 collapses and can result in liquid loss. This liquid loss is held in place by the gas knife 90. As in the FIG. 13 scenario large droplets 810 may be formed when a change in direction is made. Large droplets 810 may result in large bubbles 820 which may then appear in the image field 900.

By using the above equations, the parameters described above can be tuned to avoid bubbles forming in the image field. For example, for a given set of substrate table parameters, the diameter of the gas knife can be chosen to avoid bubbles forming in the image field. Similarly, for the case where there is no gas knife, if the meniscus diameter is chosen to be large enough so that bubbles are generated outside of the image field (using the same formulae as above but replacing $D_{AK}$ with $D_{meniscus}$) this will not result in a printing defect.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

In an embodiment, there is provided an immersion lithographic apparatus. The immersion lithographic apparatus comprises a fluid handling system. The fluid handling system is configured to supply a fluid. The fluid handling system comprises a chamber with a plurality of inlet holes in a first side wall and a plurality of outlet holes in a second side wall. The first side wall faces the second side wall. The inlet holes are arranged to direct fluid entering the chamber in a direction towards areas of the second side wall between the plurality of outlet holes.

The plurality of inlet holes and/or the plurality of outlet holes may be in a two dimensional array. The plurality of inlet holes and the plurality of outlet holes may have the same pattern. The pattern of the inlet holes may be out of phase with the pattern of the outlet holes.

The outlet holes may have an equal opening dimension or a larger opening dimension than the inlet holes. In use, a pressure drop of fluid over the first side wall may be equal to or greater than a pressure drop of fluid over the second side wall. The first and second side walls may be spaced between 0.2 and 3 mm apart, desirably between 2 and 3 mm apart.

The fluid handling system may be arranged to supply a fluid to a space between a projection system of the immersion lithographic apparatus and a substrate and/or substrate table of the immersion lithographic apparatus. The second side wall may be in a plane substantially parallel to an optical axis of the projection system. The outlet holes may be in a plane or planes perpendicular to an optical axis of the projection system which plane or planes are above a bottom of a final element of the projection system. The fluid handling system may further comprise a projection which extends inwardly towards the projection system. The projection may be positioned to project from a top of the second side wall.

In an embodiment, there is provided an immersion lithographic apparatus comprising: a fluid handling system. The fluid handling system may be configured to supply a fluid. The fluid handling system may comprise a first plate and a second plate. The first plate may have a plurality of through holes for passage therethrough of fluid. The second plate may have a plurality of through holes for passage therethrough of fluid. The first and second plates may be substantially parallel and fluid supplied by the fluid handling system is arranged to pass through the plurality of through holes in the first plate prior to passing through the plurality of holes in the second plate.

The first and second plates may be substantially parallel with an optical axis of the apparatus. In an embodiment, no through holes in the first plate are coaxial with any through holes in the second plate.

In side elevation the through holes in the first plate may not align with the through holes in the second plate. The through holes in the first plate may have the same pattern as the through holes in the second plate. When viewed in side elevation the patterns may be out of phase or inversed. An area of the first plate through which the through holes pass and an area of the second plate through which the through holes pass may be substantially at the same height.

In an embodiment, there is provided an immersion lithographic apparatus comprising: a fluid handling system. The fluid handling system may be configured to supply a fluid. The fluid handling system may comprise a flow passageway and at lest two barriers for flow present in the passageway. The flow passageway may be from an inlet to an outlet. Each barrier may comprise a plurality of through holes for passage of fluid therethrough. The two barriers may be separated by between 0.2 and 5 mm. One of the two barriers may comprise the outlet.

In an embodiment, there is provided an immersion lithographic apparatus comprising a fluid handling system configured to supply a fluid. The fluid handling system may comprise a chamber with a plurality of inlet holes in a first side wall and a plurality of outlet holes in a second side wall. The plurality of inlet holes may have a smaller opening dimension than the plurality of outlet holes.

The inlet holes may have an opening dimension of between 100-300 μm and/or the outlet holes may have an opening dimension of between 300-700 μm. A ratio of the area of the wall which is through holes to the area which is not through holes may be greater for the second wall than for the first wall.

In an embodiment there is provided an immersion lithographic apparatus comprising a fluid handling system configured to supply a fluid through an inlet. The inlet may comprise at least two spaced-apart plate members facing each other and each having a plurality of through holes. For the flow of fluid through the inlet, the through holes of one plate member may be non-aligned with the through holes of another plate member.

The plurality of through holes of the plate members may be without overlap. The plate members may be configured to provide a uniform pressure distribution over the inlet. The fluid handling system may be configured to supply fluid to a space defined between a substrate table and/or a substrate. A projection system may be configured to direct a patterned beam of radiation onto a target portion of the substrate. The substrate table may be configured to support the substrate, wherein the inlet in part defines the space.

In an embodiment there is provided an immersion lithographic apparatus comprising: a fluid handling system configured to supply a fluid through an inlet to a space between a projection system and a substrate and/or a substrate table. The inlet may comprise a plurality of openings. The inlet may be configured to supply a smooth fluid flow, into the space, substantially perpendicular to a plane parallel to the inlet. The cross-sectional flow rate of the fluid flow may be substantially uniform.

The plurality of openings may be in an array and have a periodic pattern. The pattern may be hexagonal.

In an embodiment there is provided an immersion lithographic apparatus comprising: a fluid handling system configured to supply a fluid through an inlet to a space between a projection system and a substrate and/or a substrate table. The inlet may comprise a plurality of openings arranged in a planar surface. The inlet may be configured to supply a smooth fluid flow, into the space, substantially perpendicular to a plane parallel to the inlet, the cross-sectional flow rate of the fluid flow being substantially uniform.

In an embodiment there is provided an immersion lithographic apparatus comprising: a substrate table configured to support a substrate; and a fluid handling system. The fluid handling system may be located above the substrate table and/or a substrate. The fluid handling system may include an extractor with a porous member. The porous member may have a surface with at least a portion that is curved such that a distance between the surface of the porous member and a surface of the substrate and/or the substrate table facing the fluid handling system increases from a radially innermost position to a radially outermost position without a step change in angle between the porous member and the top surface.

In an embodiment there is provided a method of manufacturing a device, the method comprising: confining immersion liquid in a space. The space may be defined between a projection system, a substrate and/or substrate table, a fluid handling structure, and a meniscus of immersion liquid which extends between the fluid handling structure and the substrate and/or substrate table. The projection system may be arranged to project a beam of patterned radiation onto an imaging field at a target portion of the substrate and the substrate table arranged to support the substrate. The method comprises: causing relative motion between the projection system and the substrate and/or substrate table so that on a change of direction of the relative motion, a liquid droplet formed on the surface of the substrate and/or the substrate table has a displacement relative to an end of the imaging field in a lengthwise direction larger than a length of the imaging field.

In an embodiment, there is provide an immersion lithographic apparatus comprising: a substrate table configured to support a substrate; a fluid handling structure; and an actuator. The fluid handling structure may be constructed and arranged to confine immersion liquid in a space. The space may be defined between a projection system configured to project a beam of patterned radiation onto an imaging field at a target portion of the substrate, a substrate and/or a substrate table, and, in use, an immersion liquid meniscus which extends between the fluid handling structure and the substrate table and/or the substrate. The actuator may be configured to cause relative motion between the projection system and the substrate and/or substrate table, so that on a change of direction of the relative motion a liquid droplet on the surface of the substrate and/or the substrate table has a displacement relative to an end of the imaging field in a lengthwise direction larger than a length of the imaging field. A controller may be configured to control the actuator.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising a fluid handling system configured to supply a fluid, the fluid handling system comprising a chamber with a plurality of inlet holes in a first side wall and a plurality of outlet holes arranged in a two dimensional array in a second side wall, the first side wall facing the second side wall, wherein the inlet holes are arranged to direct fluid entering the chamber in a direction towards areas of the second side wall between the plurality of outlet holes, wherein a perpendicular extending from the inlet holes intersects the areas of the second side wall between rows of the plurality of outlet holes and between columns of the plurality of outlet holes and the plurality of inlet holes do not overlap the plurality of outlet holes.

2. The immersion lithographic apparatus of claim 1, wherein the plurality of inlet holes are in a two dimensional array.

3. The immersion lithographic apparatus of claim 1, wherein the plurality of inlet holes and the plurality of outlet holes have the same pattern.

4. The immersion lithographic apparatus of claim 3, wherein the pattern of the inlet holes is out of phase with the pattern of the outlet holes.

5. The immersion lithographic apparatus of claim 1, wherein the outlet holes have a larger opening dimension than the inlet holes.

6. The immersion lithographic apparatus of claim 1, wherein the first and second side walls are spaced between 0.2 and 3 mm apart.

7. The immersion lithographic apparatus of claim 1, wherein the fluid handling system is arranged to supply a fluid to a space between a projection system of the immersion lithographic apparatus and a substrate and/or substrate table of the immersion lithographic apparatus.

8. The immersion lithographic apparatus of claim 7, wherein the second side wall is in a plane substantially parallel to an optical axis of the projection system.

9. The immersion lithographic apparatus of claim 7, wherein the outlet holes are in a plane or planes perpendicular to an optical axis of the projection system which plane or planes are above a bottom of a final element of the projection system.

10. The immersion lithographic apparatus of claim 7, wherein the fluid handling system further comprises a projection which extends inwardly towards the projection system, the projection being positioned to project from a top of the second side wall.

11. The immersion lithographic apparatus of claim 1, wherein, in use, a pressure drop of fluid over the first side wall is greater than a pressure drop of fluid over the second side wall.

12. An immersion lithographic apparatus comprising:
a projection system configured to transfer a pattern to a substrate;
a fluid handling system configured to supply a fluid, the fluid handling system comprising:
a first plate with a plurality of through holes for passage therethrough of fluid; and
a second plate with a plurality of through holes arranged in a two dimensional array for passage therethrough of fluid,
wherein the first and second plates are substantially parallel and fluid supplied by the fluid handling system is arranged to pass through the plurality of through holes in the first plate prior to passing through the plurality of holes in the second plate, the through holes of the first plate are non-aligned in at least 2 orthogonal directions with the through holes of the second plate, do not overlap the through holes of the second plate, and face the through holes of the second plate and wherein, in use, a pressure drop of fluid over the first plate is greater than a pressure drop of fluid over the second plate.

13. An immersion lithographic apparatus comprising:
a fluid handling system configured to supply a fluid, the fluid handling system comprising:
a flow passageway from an inlet to an outlet; and
at least two barriers for flow present in the passageway, each barrier comprising a plurality of through holes for passage of fluid therethrough, the two barriers being separated by between 0.2 and 5 mm, the through holes of one barrier face the through holes of another barrier, and the through holes of one barrier are non-aligned with the through holes of another barrier.

14. An immersion lithographic apparatus comprising a fluid handling system configured to supply a fluid, the fluid handling system comprising a chamber with a plurality of inlet holes in a first side wall to supply the fluid to a plurality of outlet holes in a second side wall of the chamber, the plurality of inlet holes of the first side wall facing the plurality of outlet holes of the second side wall, the plurality of inlet holes not overlapping the plurality of outlet holes, the plurality of outlet holes arranged to supply the fluid as a flow to a space between a projection system and a substrate and/or a substrate table, and the plurality of inlet holes having a smaller opening dimension than the plurality of outlet holes.

15. An immersion lithographic apparatus comprising:

a projection system configured to transfer a pattern to a substrate; and a fluid handling system configured to supply a fluid through an inlet, the inlet comprising at least two spaced-apart plate members facing each other and each having a plurality of through holes arranged in a two dimensional array, wherein for the flow of fluid through the inlet, the through holes of one plate member are non-aligned with in at least 2 orthogonal directions, and do not overlap, the through holes of another plate member and face the through holes of the another plate member, wherein the through holes of one of the plate members supplies the fluid directly to a space between the projection system and a table.

16. A method of manufacturing a device, the method comprising:

supplying a fluid to a space between a projection system and a table directly from a plurality of outlet holes arranged in a two dimensional array by supplying the fluid through a plurality of inlet holes facing the plurality of outlet holes, wherein the inlet holes are arranged to direct fluid in a direction towards areas of a wall between the plurality of outlet holes, wherein a perpendicular extending from the inlet holes intersects the areas of the wall between rows of the plurality of outlet holes and between columns of the plurality of outlet holes and the plurality of inlet holes do not overlap the plurality of outlet holes; and projecting a beam of radiation, through the liquid in the space, onto an imaging field at a target portion of a substrate.

17. A method of manufacturing a device, the method comprising:

supplying a fluid to a space by supplying the fluid through a plurality of inlet holes in a first side wall of a chamber to a plurality of outlet holes in a second side wall of the chamber, the plurality of inlet holes of the first side wall facing the plurality of outlet holes of the second side wall, the plurality of inlet holes not overlapping the plurality of outlet holes, the plurality of outlet holes supplying the fluid as a flow to the space, and the plurality of inlet holes having a smaller opening dimension than the plurality of outlet holes; and projecting a beam of radiation, through the liquid in the space, onto an imaging field at a target portion of a substrate.

18. A method of manufacturing a device, the method comprising:

supplying a fluid to a space between a projection system and a table by supplying the fluid through an inlet, the inlet comprising at least two spaced-apart plate members facing each other and each having a plurality of through holes arranged in a two dimensional array, wherein for the flow of fluid through the inlet, the through holes of one plate member are non-aligned in at least 2 orthogonal directions with the through holes of another plate member, do not overlap the through holes of the another plate member, and face the through holes of the another plate member, wherein the through holes of one of the plate members supplies the fluid directly to the space; and projecting a beam of radiation, through the liquid in the space, onto an imaging field at a target portion of a substrate.

19. A method of manufacturing a device, the method comprising:

supplying a fluid to a space through an inlet, the inlet comprising a first plate with a plurality of through holes for passage therethrough of fluid and a second plate with a plurality of through holes arranged in a two dimensional array for passage therethrough of fluid, wherein the first and second plates are substantially parallel and fluid supplied by the fluid handling system is arranged to pass through the plurality of through holes in the first plate prior to passing through the plurality of holes in the second plate, the through holes of the first plate are non-aligned in at least 2 orthogonal directions with the through holes of the second plate, do not overlap the through holes of the second plate, and face the through holes of the second plate and wherein, in use, a pressure drop of fluid over the first plate is greater than a pressure drop of fluid over the second plate; and projecting a beam of radiation, through the liquid in the space, onto an imaging field at a target portion of a substrate.

20. A method of manufacturing a device, the method comprising:

supplying a fluid to a space through at least two barriers for flow present in a passageway, each barrier comprising a plurality of through holes for passage of fluid therethrough, the two barriers being separated by between 0.2 and 5 mm and the through holes of one barrier are non-aligned with the through holes of another barrier; and projecting a beam of radiation, through the liquid in the space, onto an imaging field at a target portion of a substrate.

* * * * *